(12) United States Patent
Matsumoto et al.

(10) Patent No.: US 6,605,392 B2
(45) Date of Patent: *Aug. 12, 2003

(54) X-RAY MASK STRUCTURE, AND X-RAY EXPOSURE METHOD AND APPARATUS USING THE SAME

(75) Inventors: Takahiro Matsumoto, Utsunomiya (JP); Keiko Chiba, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/335,494

(22) Filed: Jun. 18, 1999

(65) Prior Publication Data
US 2002/0018941 A1 Feb. 14, 2002

(30) Foreign Application Priority Data
Jun. 19, 1998 (JP) .......................... 10-173394

(51) Int. Cl.[7] .................................. G03F 9/00
(52) U.S. Cl. ................... 430/5; 378/35; 428/14
(58) Field of Search ............... 430/5; 378/34, 378/35; 428/14; 355/75

(56) References Cited

U.S. PATENT DOCUMENTS

| 4,735,877 A | 4/1988 | Kato et al. ............... 430/5 |
| 5,168,001 A | * 12/1992 | Legare et al. ............ 428/194 |
| 5,291,536 A | * 3/1994 | Itoh et al. ................. 378/35 |
| 5,394,219 A | * 2/1995 | Hirosue .................... 355/77 |
| 5,422,921 A | 6/1995 | Chiba ....................... 378/34 |
| 5,553,110 A | 9/1996 | Sentoku et al. ........... 378/35 |
| 5,674,624 A | * 10/1997 | Miyazaki et al. ........ 428/422 |
| 5,677,090 A | * 10/1997 | Marumoto et al. ......... 430/5 |
| 5,870,448 A | 2/1999 | Machara et al. .......... 378/35 |

FOREIGN PATENT DOCUMENTS

| JP | 63-72119 | 4/1988 |
| JP | 3-293716 | 12/1991 |
| JP | 7-49926 | 5/1995 |

\* cited by examiner

Primary Examiner—Mark F. Huff
Assistant Examiner—Saleha R. Mohamedulla
(74) Attorney, Agent, or Firm—Fitzpatrick, Cella, Harper & Scinto

(57) ABSTRACT

An X-ray mask structure for use in X-ray lithography includes an X-ray transmission film to be disposed opposed to a workpiece in X-ray exposure, the X-ray transmission film having an X-ray absorptive material corresponding to a pattern to be printed on the workpiece, and a thin film covering at least a portion of the X-ray transmission film, the thin film having an anti-reflection function with respect to alignment light to be projected to the thin film for direct or indirect detection of relative positional deviation between the mask structure and the workpiece.

20 Claims, 13 Drawing Sheets

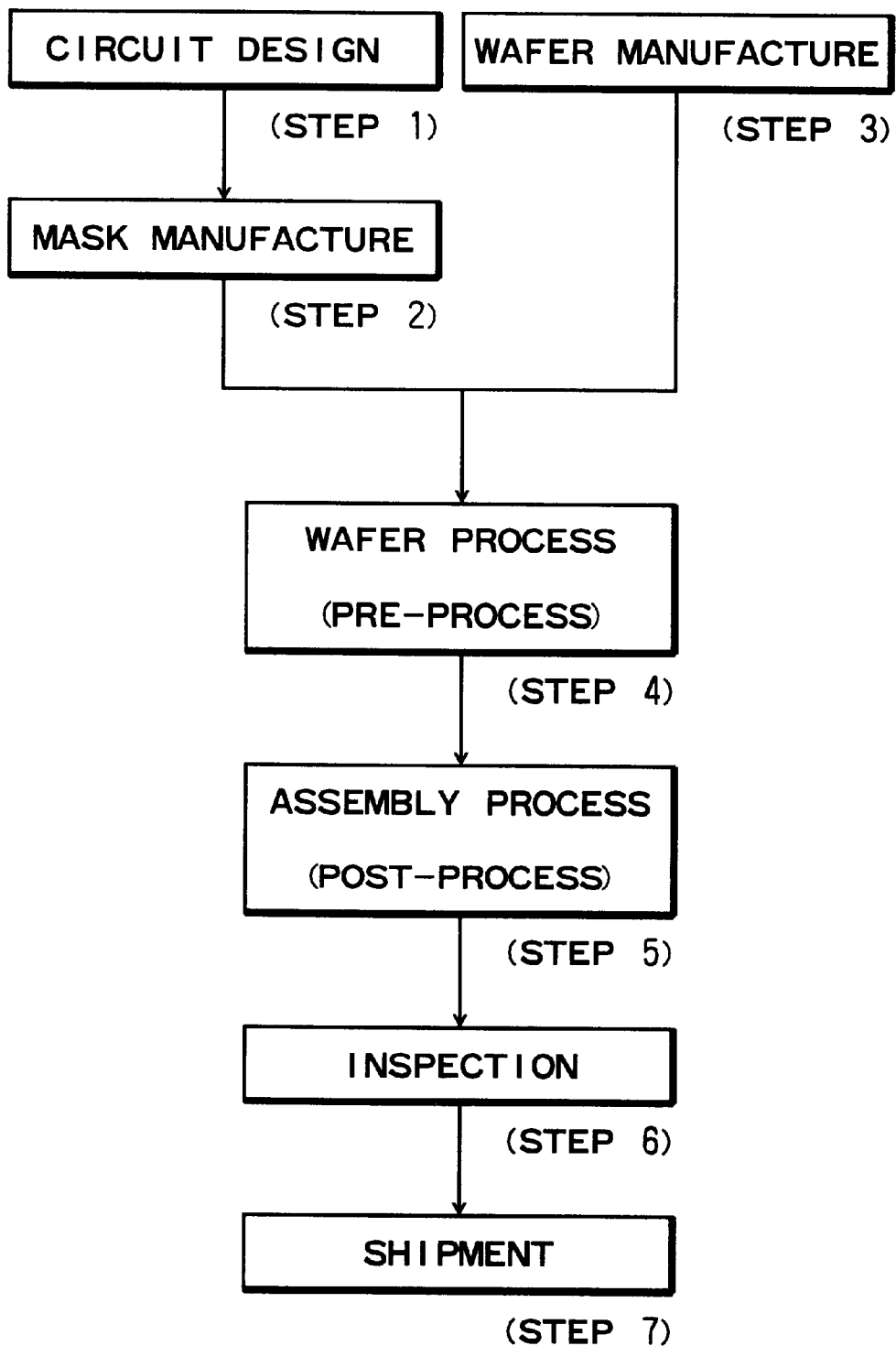
F I G. 18

X-RAY MASK STRUCTURE, AND X-RAY EXPOSURE METHOD AND APPARATUS USING THE SAME

FIELD OF THE INVENTION AND RELATED ART

This invention relates generally to an X-ray mask structure for use in X-ray lithography. The invention further relates to an X-ray exposure method and apparatus and a semiconductor device manufacturing method which use such an X-ray mask structure. The invention still further relates to a semiconductor device to be produced on the basis of the semiconductor device manufacturing method.

In the stream of an increases in density and speed of a semiconductor integrated circuit, reduction in the linewidth of an integrated circuit pattern and improvement in the device manufacturing method have been required. In order to meet this, steppers as X-ray exposure apparatus using exposure light of an X-ray region (2–150 angstroms) have been developed.

X-ray mask structures for such X-ray exposure apparatus are usually such as shown in FIG. 1A. FIG. 1A is a sectional view of a conventional X-ray mask structure. As shown, the X-ray mask structure comprises at least an X-ray absorptive member 112, a supporting member 111 for supporting the absorptive member 112, and a holding frame 113 for holding the supporting member 111. There may be a reinforcing member 104 for reinforcing the holding frame 113 which may be adhered to the reinforcing member by an adhesive agent 105.

For mass production of semiconductor devices using an X-ray mask structure as shown in FIG. 1A, dust protection of the X-ray mask structure is inevitable. Generally, dust protection for an X-ray mask structure during exposures of wafers uses a thin film (pellicle) as a dust protection film. In the past, organic particles have a small influence on X-ray lithography, and no specific measure has been taken with respect to protection against dust at the dust protection film. However, with further reduction of a pattern to be produced by X-ray lithography, the presence of organic dust becomes influential to the exposure amount distribution, and it cannot be disregarded.

FIG. 1B is a sectional view of an X-ray mask structure with a thin film (pellicle) as a dust protection film (Japanese Laid-Open Patent Application, Laid-Open No. 72119/1988). In the X-ray mask structure shown in FIG. 1B, like that of FIG. 1A, an X-ray absorptive member 212 is supported by a supporting member 211 which is held by a holding frame 213. The frame 213 is adhered to a reinforcing member 204, for reinforcing the frame 213, by using an adhesive agent 205. A thin film (pellicle) 216 as a dust protection film is detachably fixed on the supporting film 211 through a frame 217. With this structure, the space at the wafer side of the supporting film 211 is covered by the thin film 216, whereby the supporting film 211 is protected against dust such as particles.

Another measure to provide dust protection may be cleaning an X-ray mask structure. However, because of a high aspect of the X-ray absorptive member of the X-ray mask structure, cleaning the X-ray mask structure is very difficult to accomplish. There may remain dust not removed by the cleaning. Further, since the supporting film for supporting the X-ray absorptive member is thin, its strength is low. The times of cleaning operations must be kept small. Additionally, while there is a high possibility that an electron beam is used for dust inspection, the dust inspection to be performed in the use of an X-ray mask structure may use light. However, it requires a very complicated process to discriminate dust and a pattern of high aspect. Also, in the stream of reduction in line width, a resist for pattern formation on a workpiece may use a chemical amplification type resist material. Depending on the resist used, a decomposition product may be created during the exposure process. Such a decomposition product may be adhered to the X-ray mask structure, which is a factor for causing a change with time of the X-ray mask structure.

When an X-ray mask structure with a pellicle is used in an exposure process (Japanese Laid-Open Patent Application, Laid-Open No. 72119/1988), there may be a problem in relation to alignment of the X-ray mask structure with the X-ray exposure apparatus or to alignment of a wafer to be exposed through the X-ray mask structure. This problem will be described below, with respect to an example of an optical heterodyne interference method used in an alignment detection system of a typical X-ray exposure apparatus.

FIG. 1C is a schematic view for explaining a process of detecting a phase difference between two beat signals on the basis of an optical heterodyne interference method (Japanese Published Patent Application, Publication No. 49926/1995). As shown in FIG. 1C, a supporting film 311 of an X-ray mask structure has a straight diffraction grating 320. On the face of the film 311 at the wafer 322 side, there is a thin film (pellicle) 316 which is fixed through a frame 317. On the top of the wafer 322, there is a straight diffraction grating 321 formed.

Alignment light 323 of a frequency $f_1$ and alignment light 324 of a frequency $f_2$ are projected and, in response, diffraction lights from the straight diffraction gratings 120 and 121 are caused to interfere with each other, whereby signal light 331 and signal light 332 are produced. On the basis of an optical heterodyne interference method, a phase difference between two beat signals is detected. Here, the thin film 316 reflects alignment light, such that noise light 333 is produced which goes along a path different from the signal light. The noise light 333 interferes with the signal light, causing a change in phase difference of beat signals. Because of this, it may become difficult to accurately detect a relative positional deviation of the X-ray mask structure and the wafer 322. As regards the light produced by reflection at the thin film 316, in addition to the noise light 333, there are plural noise lights coming along various light paths, reflected by the thin film 316. This causes adverse influence to detection of the positional deviation. Further, for a change in spacing (gap) between the X-ray mask structure and the wafer or any tilt of the mask structure to the wafer, a measured value of positional deviation may vary sensitively. Also, the intensity of alignment light passing through the pellicle of the X-ray mask structure may be reduced, and a sufficient signal level for keeping the precision for positional deviation detection may not be maintained.

This problem may apply to other alignment methods. In a method where a mask and a wafer are provided with grating lenses and a deflection angle of diffraction light by the grating lenses is measured, or in a method where images of marks of a mask and a wafer are detected, similarly, reflection of alignment light at a pellicle may produce noise light or a ghost image, causing lower alignment detection precision.

SUMMARY OF THE INVENTION

It is an object of the present invention to provide an X-ray mask structure by which, when alignment light is projected to the X-ray mask structure with a dust protection thin film, for detection of the position thereof, any positional deviation of the X-ray mask structure can be detected very precisely, such that the X-ray mask structure can be positioned very precisely.

It is another object of the present invention to provide an X-ray exposure method and apparatus using such an X-ray mask structure, by which high precision printing and mass production are enabled.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 18 is a flow chart of semiconductor device manufacturing processes, using an X-ray mask structure according to the present invention.

DESCRIPTION OF THE PREFERRED EMBODIMENTS

First Embodiment

Figure 1A:
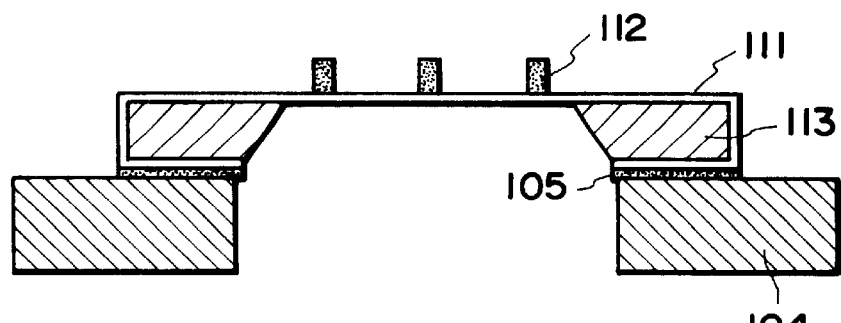
FIG. 1A is a sectional view of a conventional X-ray mask structure.
Figure 1B:
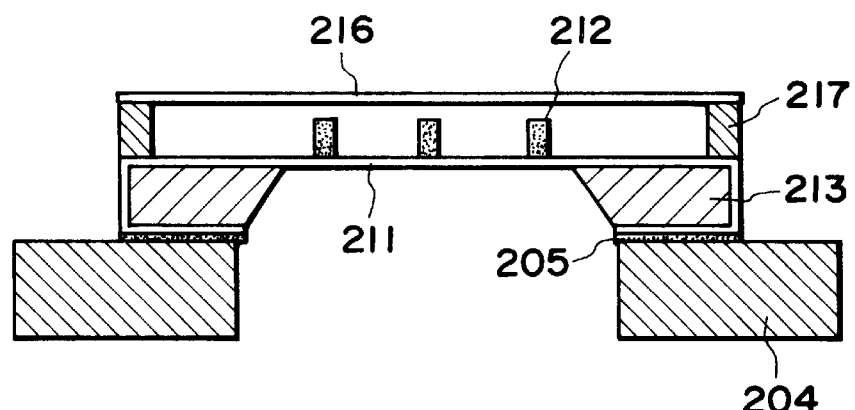
FIG. 1B is a sectional view of a conventional X-ray mask structure.
Figure 1C:
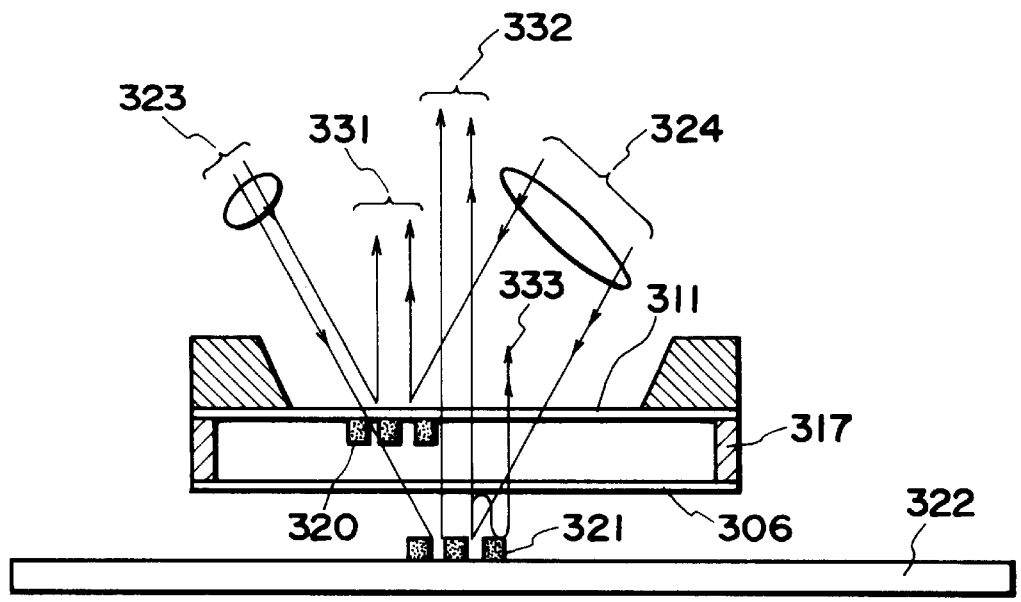
FIG. 1C is a schematic view for explaining a process of aligning an X-ray mask and a wafer.
Figure 2A:
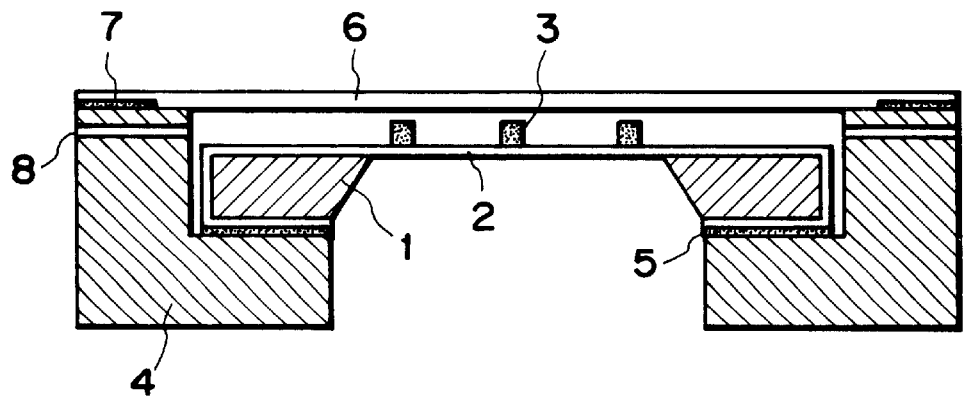
FIG. 2A is a sectional view of an X-ray mask structure according to a first embodiment of the present invention.

FIG. 2A is a sectional view of an X-ray mask structure according to a first embodiment of the present invention. In the X-ray mask structure of this embodiment, as shown in FIG. 2A, an X-ray absorptive material 3 is formed in accordance with a pattern to be printed, and a supporting film (X-ray transmission film) 2 is held by a holding frame 1 so that it is opposed to a workpiece, to be exposed, placed in the exposure apparatus. The holding frame 1 is made of Si of a thickness of 2 mm. The supporting film 2 has X-ray transmissivity, and it comprises a SiC film of thickness of 2.0 microns, formed by a CVD process. The X-ray absorptive member 3 is formed by plating, and the material thereof is Au. The holding frame 1 is fixed to a reinforcing member 4 by an adhesive agent 5. The reinforcing member is made of SiC.

At the top face of the reinforcing member 4, that is, at the surface to be opposed to a workpiece in an exposure process, there is a thin film (pellicle) 6 which is detachably adhered thereon by an adhesive agent 7. The top face of the reinforcing member 4 is disposed closer to the workpiece than the supporting film 2 is. Thus, the thin film 6 is placed closer to the workpiece than the supporting film 2 is, and the thin film 6 covers the space at the workpiece side of the supporting film 2. The reinforcing member 4 is machined so that a gap of 5 microns is defined between the supporting film 2 and the thin film 6 adhered to the reinforcing member 4. The thin film 6 is adhered by adhesive agent 7 which allows easy detachment. The reinforcing member 4 is formed with bores for pressure difference adjustment, having filters for dust protection. Since these bores are provided to reduce deformation of the supporting film 2 and the thin film 6 as the mask structure is placed in a pressure ambience largely different from that in which the mask structure was manufactured, the bores 8 may be omitted if there is no such pressure difference.

Mounting the thin film 6 on the X-ray mask structure with easily detachable adhesive agent 7 effectively prevents direct adhesion of dust to the surface of the supporting film 2. Also, it reduces or avoids the necessity of mask cleaning. Further, it prevents adhesion of dust to a high aspect pattern formed on the supporting film 2 or damage of the supporting film 2 due to cleaning thereof. Additionally, even if dust is adhered to the thin film 6, it can be detected easily by using light. Dust adhesion can be easily met by clearing the thin film 6 or by replacing it by another. Since the thin film 6 has high precision flatness and it is mounted on the X-ray mask structure precisely, it has no influence on the gap between the workpiece and the supporting film 2 when placed in the X-ray exposure apparatus.

With prevention of influence of dust to the supporting film 2 as described, an X-ray mask structure suitable for mask production of microdevices is accomplished.

Figure 2B:
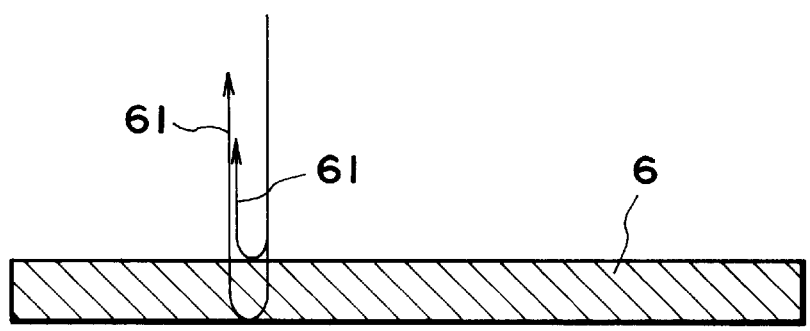
FIG. 2B is a schematic view for explaining reflection of alignment light at the top and bottom of a thin film of the X-ray mask structure of FIG. 2A.

Referring to FIG. 2B, an anti-reflection function of the thin film (pellicle) 6 to alignment light will be described. FIG. 2B is a schematic view for explaining reflection of alignment light at the top and bottom of the thin film 6 of FIG. 2A. In FIG. 2B, when alignment light is projected on the top surface of the thin film 6 from above, a portion of the alignment light is reflected by the surface of the film 6, whereby surface reflection light 61 is produced. Of the alignment light projected on the thin film 6, a portion not reflected by the film surface but passed therethrough is reflected at the bottom of the thin film 6 back to the top surface thereof, whereby bottom reflection light 62 is produced. The bottom reflection light 62 goes through the top surface of the film 6, and it is combined with the alignment light reflected by the top surface of the film 6.

A reflection factor $R_{sum}$ of the thus combined light, comprising the light reflected by the top face of the film 6 and the light reflected by the bottom of the film 6, can be represented by an Airy equation, as follows, when R is the reflection factor at the top face or bottom face of the film 6 and δ is the phase difference between the lights reflected by the top and bottom of the film 6 as determined by the optical path difference therebetween:

$$R_{sum} = 4R \sin(\delta/2)/[(1-R)^2 + 4R \sin^2(\delta/2)] \quad (1)$$

Here, the reflection factor R of the top or bottom of the film 6 is represented by the following equation, when n is the refractive index of the film 6 and $n_0$ is the refractive index of the ambience surrounding the film 6:

$$R = [(n-n_0)/(n+n_0)]^2 \quad (2)$$

When the thickness of film 6 is t and the refraction angle of alignment light within the film 6 as the alignment light is incident on the film 6 with an incidence angle θ is θ', the phase difference δ of lights reflected at the top and bottom of the film 6 is expressed as follows:

$$\delta = 4\pi n t \cos(\theta')/\lambda \quad (3)$$

Here, there is a relation, as follows, between the refraction angle θ' and the incidence angle θ of alignment light incident on the film 6:

$$\theta' = \sin^{-1}[n_0 \sin(\theta)/n] \quad (4)$$

In equation (3), as regards the refraction angle θ', if the incidence angle θ is small, that is, if it can be approximated that cos(θ')=1, it can be approximated as being δ=4πnt/λ for the equation in perpendicular incidence, where λ is the wavelength of alignment light.

It is seen from equations (1)–(4) that, for minimization of the reflection factor $R_{sum}$ of combined light at the film 6 of SiC, when m is a natural number, the thickness $t_{min}$ of film 6 should satisfy:

$$t_{min} = m\lambda/(2n) \quad (5)$$

As regards the wavelength λ of alignment light, generally plural wavelengths are used in order to keep a good signal intensity even though the step (level difference) of an alignment mark formed on the wafer changes. In this embodiment, therefore, the thin film 6 is provided with a reflection preventing function with respect to plural wavelengths of alignment light.

Figure 3:
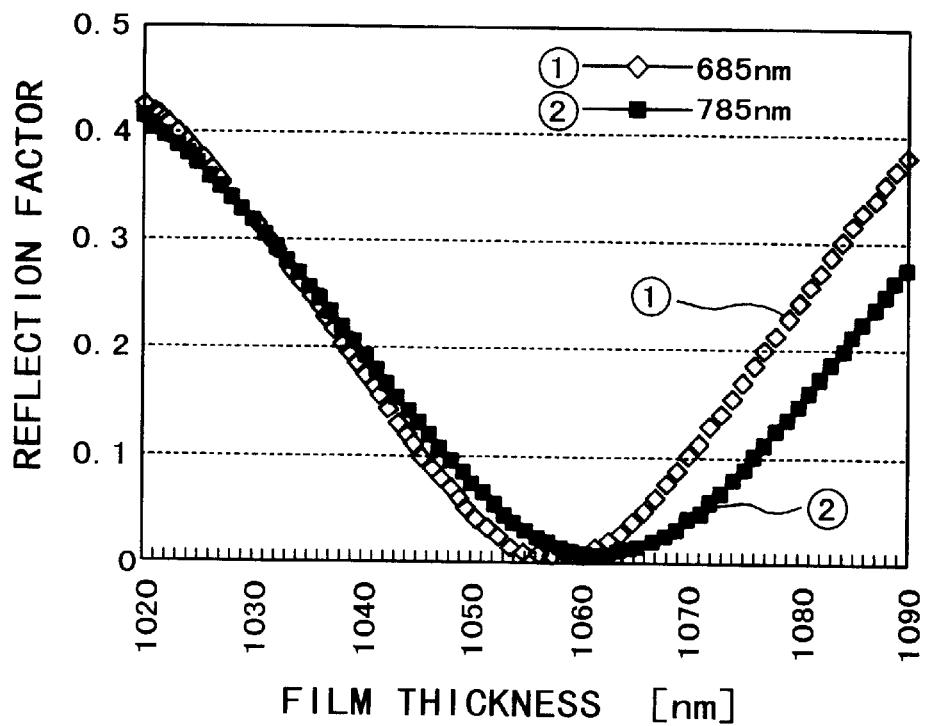
FIG. 3 is a graph for explaining an anti-reflection function of the thin film of the X-ray mask structure of FIG. 2A, to alignment light.

FIG. 3 is a graph for explaining an anti-reflection function of film 6 of the X-ray mask structure of FIG. 2A, with respect to alignment light. FIG. 3 shows the results of calculation of the reflection factor, being made in accordance with equations (1)–(4) and a refraction factor of SiC film of n=2.6, and with respect to wavelengths $\lambda_1$=685 nm and $\lambda_2$=785 nm of light to be used in an alignment process (to be described later). The axis of abscissa in FIG. 3 denotes the thickness (nm) of film 6, and the axis of ordinate denotes the reflection factor (%). A curve #1 represents the reflection factor of film 6 with respect to wavelength $\lambda_1$=685 nm, and a curve #2 represents the reflection factor of film 6 with respect to wavelength $\lambda_2$=785 nm.

As shown in FIG. 3, since in a conventional X-ray mask structure a dust protection film is used without taking into account the reflection factor to alignment light, depending on the thickness of the dust protection film, reflection light of 40% or more may be produced at the dust protection film. It is seen from FIG. 3 that, when the thin film (SiC film) 6 is formed with a thickness 1060±2 nm, the reflection factor of film 6 to alignment light of wavelength $\lambda_1$=685 nm and $\lambda_2$=785 nm can be held at 1% or less. Thus, a good anti-reflection function of film 6 to alignment light of wavelengths $\lambda_1$ and $\lambda_2$ can be accomplished. The wavelengths of alignment light are not limited to them. As regards the thickness of film 6, values with which the reflection factor is minimized (equation (5)) with respect to alignment light or plural wavelengths may be determined first, and those thicknesses approximately equal to each other in relation to the plural wavelengths may be determined. Among them, a smallest thickness may be selected as the film 6 thickness, in order to reduce absorption of exposure light (X-rays) at the film 6. The surface of the film (SiC film) 6 may be polished to prevent scattering of alignment light. The material of film 6 is not limited to SiC. Similar calculations can be made when other materials are used.

Figure 4:
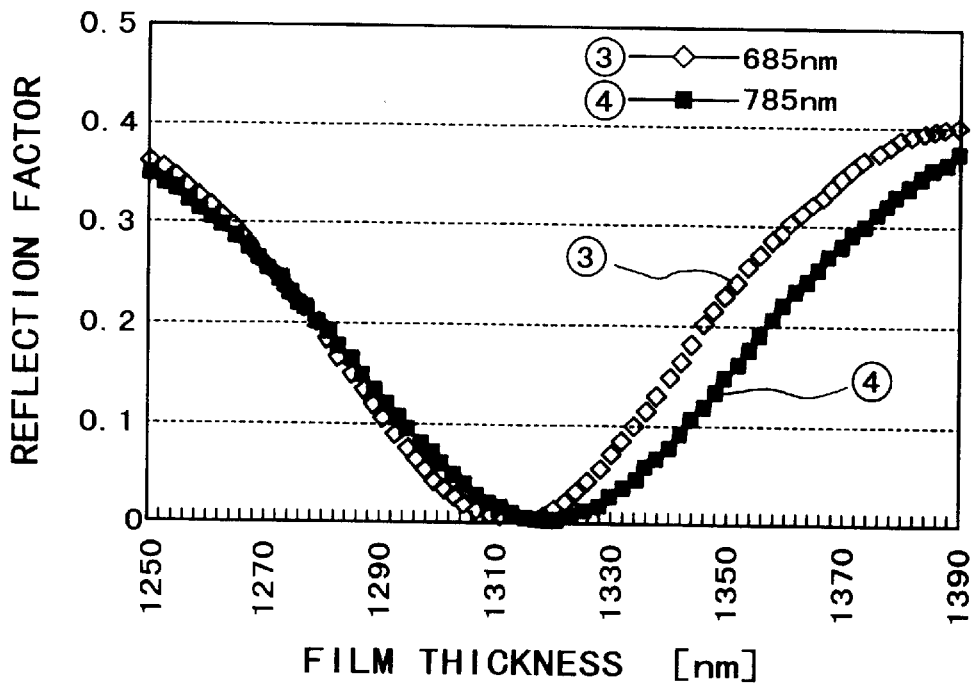
FIG. 4 is a graph for explaining an anti-reflection function of the thin film of the X-ray mask structure of FIG. 2A, to alignment light, where SiN is used as the thin film material.

FIG. 4 is a graph for explaining an anti-reflection function of film 6 to alignment light where SiN is used as the material of film 6 of the X-ray mask structure of FIG. 2A. In FIG. 4, the axis of abscissa denotes the thickness (nm) of film 6, and the axis of ordinate denotes the reflection factor (%). A curve #3 represents the reflection factor of film 6 with respect to wavelength $\lambda_1$=685 nm, and a curve #4 represents the reflection factor of film 6 with respect to wavelength $\lambda_2$=785 nm.

As shown in FIG. 4, if SiN is used for the film 6 material, an X-ray mask structure may be made with a thin film 6 of a thickness 1315±4 nm, with a result that the reflection factor of film 6 to alignment light of both wavelengths $\lambda_1$=685 nm and $\lambda_2$=785 nm can be held at 1% or less. Thus, even when film 6 is made of SiN, a good anti-reflection function of film 6 to alignment light of wavelengths $\lambda_1$ and $\lambda_2$ can be accomplished.

Figure 5:
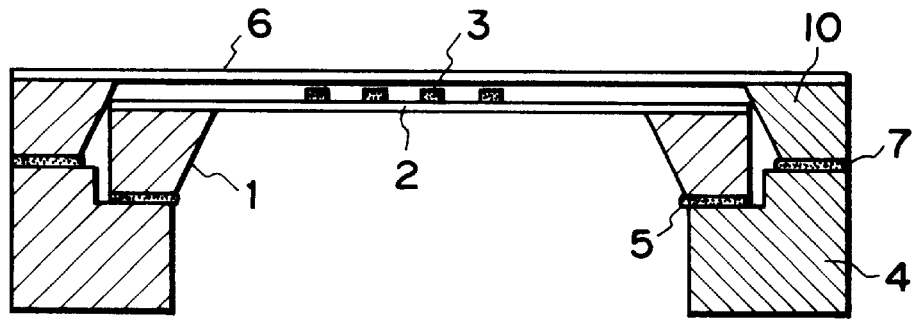
FIGS. 5, 6 and 7 are sectional views, respectively, showing modified forms of the X-ray mask structure of FIG. 2A.
Figure 6:
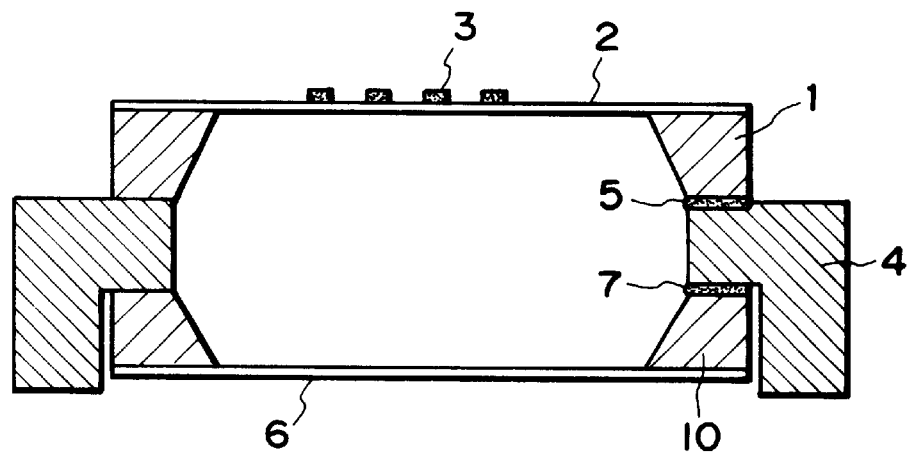
Figure 7:
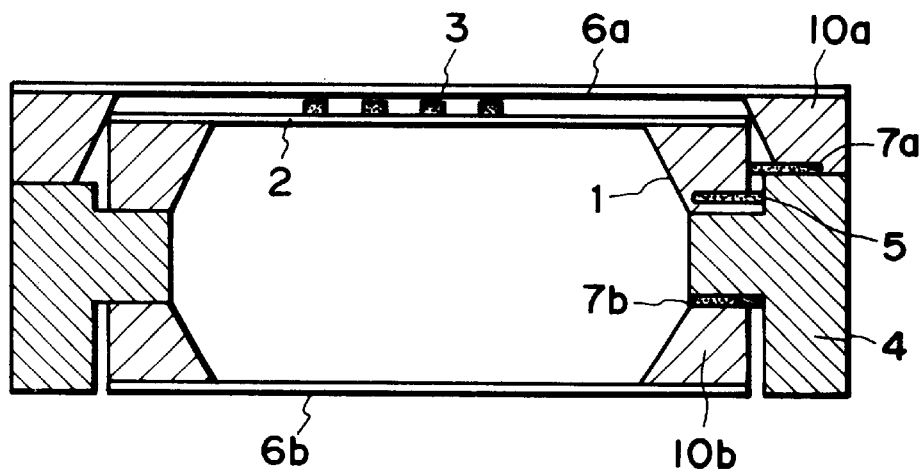

FIGS. 5, 6 and 7 show examples of modified forms of an X-ray mask structure of this embodiment, wherein FIGS. 5, 6 and 7 are sectional views of these modifications. In the X-ray mask structure of FIG. 5, like that of FIG. 2A, a pellicle thin film 6 is provided only on the X-ray absorptive material 3 side of a supporting film 2, that is, at the workpiece side thereof. The film 6 has been formed on a holding frame 10 through a CVD process. Reinforcing member 4 has been machined so that a gap of 5 microns is defined between the supporting film 2 and the thin film 6 adhered to the reinforcing member 4 through a holding frame 10. The frame 10 is mounted on the reinforcing member 4 by an adhesive agent 7 which allows easy detachment. The frame 1 and the reinforcing member 4 made of SiC are adhered to each other by an adhesive agent 5. Like the X-ray mask structure of FIG. 2A, there are pressure difference adjusting bores (not shown) for communicating the space between the films 2 and 6 with the atmosphere surrounding the mask, and dust protection filters are provided in the bores. The thin film 6 has an anti-reflection function to alignment light, as described above.

In the X-ray mask structure shown in FIG. 6, a pellicle thin film 6 is provided at the side of the supporting film 2 remote from the X-ray absorptive member 3. Thus, the film 6 covers the space at the side of the film 2 remote from the workpiece side. The film 6 has been formed on a holding frame 10 through a CVD process. Reinforcing member 4 has been machined so that a gap of 5 microns is defined between the supporting film 2 and the thin film 6 adhered to the reinforcing member 4 through a holding frame 10. The frame 10 is mounted on the reinforcing member 4 by an adhesive agent 7 which allows easy detachment. The frame 1 and the reinforcing member 4 made of SiC are adhered to each other by an adhesive agent 5. Like the X-ray mask structure of FIG. 2A, there are pressure difference adjusting bores (not shown) for communicating the space between the films 2 and 6 with the atmosphere surrounding the mask, and dust protection filters are provided in the bores. The thin film 6 has an anti-reflection function to alignment light, as described above.

In the X-ray mask structures of FIGS. 2A, 5 and 6, the thin film 6 is provided only on one side of the supporting film 2 which is determined in accordance with the source of dust created in the exposure apparatus. In the X-ray mask structure of FIG. 7, on the other hand, a pellicle thin film 6a is provided on the X-ray absorptive material 3 side of the supporting film 2 while another pellicle thin film 6b is provided on the other side of the supporting film 2, opposite to the X-ray absorptive member 3. Thus, thin films are provided on both sides (top and bottom sides) of the supporting film 2. While the mask structure is slightly complicated, as compared with the case wherein a thin film is provided only on one side, the dust protection effect of the X-ray mask structure is better.

In the X-ray mask structure of FIG. 7, the film 6a has been formed on a holding frame 10a through a CVD process. Reinforcing member 4 has been machined so that a gap of 5 microns is defined between the supporting film 2 and the thin film 6a adhered to the reinforcing member 4 through a holding frame 10a. The frame 10a is mounted on the reinforcing member 4 by an adhesive agent 7a which allows easy detachment. The film 6b has been formed on a holding frame 10b through a CVD process, and the frame 10b is mounted on the reinforcing member 4 by an adhesive agent 7b which allows easy detachment. The frame 1 and the reinforcing member 4 made of SiC are adhered to each other by an adhesive agent 5. Like the X-ray mask structure of FIG. 2A, the reinforcing member has formed therein pressure difference adjusting bores (not shown) for communicating the space between the films 2 and 6a and for communicating the space between the films 2 and 6b, with the outside atmosphere of the mask. These bores are provided with dust protection filters.

As shown in FIG. 7, the thin films are at both sides of the supporting film 2. Depending on the alignment process used, only one of these films 6a and 6b, that is, only one film through which alignment light passes may be provided with an anti-reflection function while the thickness of the other film may be reduced as much as possible to increase the X-ray transmission factor. For example, in a case wherein an off-axis alignment process is adopted and the wafer alignment is to be performed at a position different from the mask position, no alignment light passes through the mask. Therefore, the film 6a does not need an anti-reflection function. On the other hand, for the mask alignment with the exposure apparatus, alignment light passes through the mask, such that the film 6b needs an anti-reflection function.

When the X-ray mask structure of FIG. 7 is used in an exposure apparatus wherein wafer alignment is performed through the mask, both of the films 6a and 6b should have an anti-reflection function.

In the X-ray mask structures of FIGS. 2A, 5, 6 and 7, only a region of the thin film through which alignment light passes may be provided with an anti-reflection function.

Figure 8:
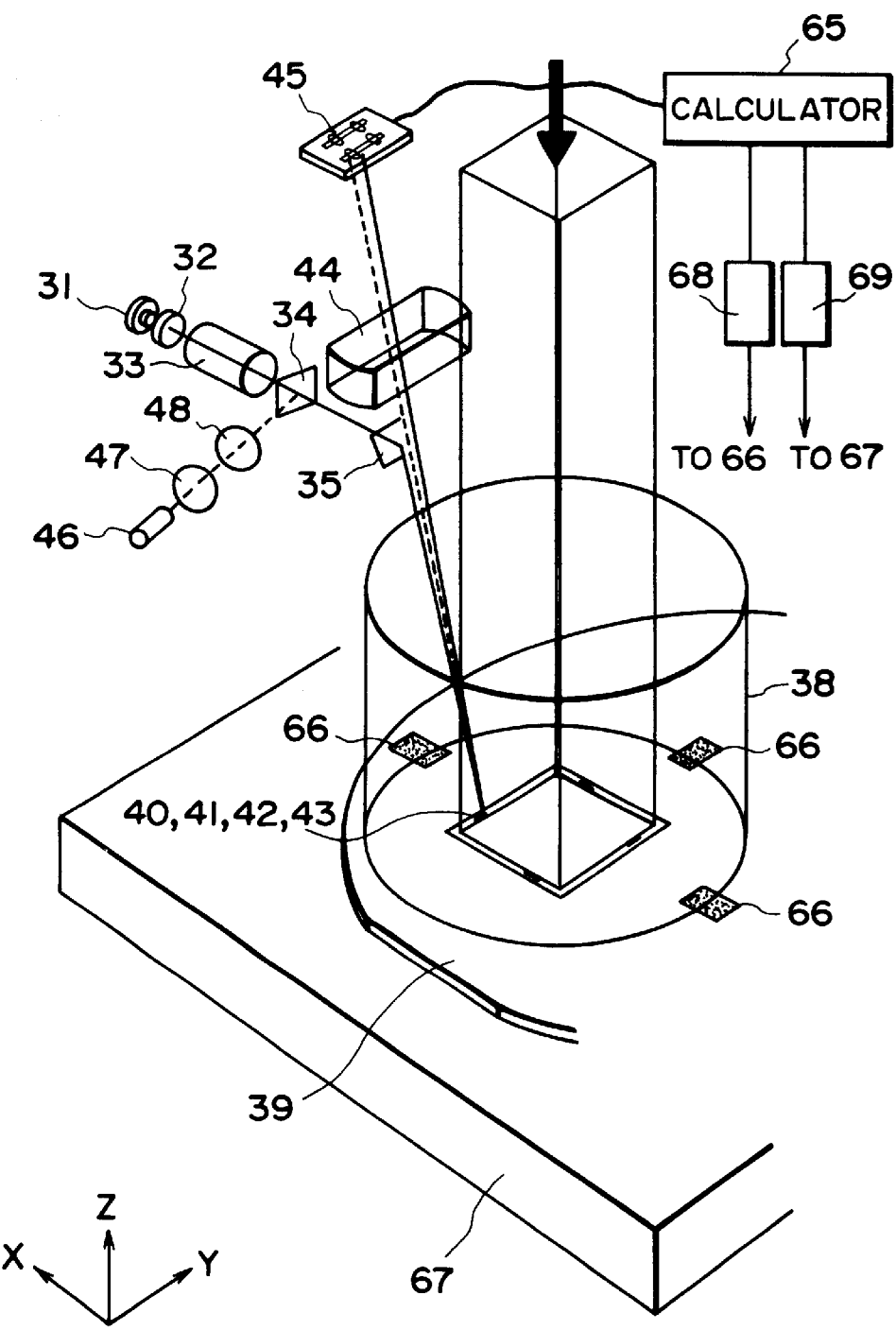
FIG. 8 is a schematic view of a main portion of an X-ray exposure apparatus using an X-ray mask structure according to the present invention.

Next, the principle of an alignment procedure in an X-ray exposure apparatus using an X-ray mask structure of this embodiment, will be described. FIG. 8 is a schematic view of a main portion of an X-ray exposure using an X-ray mask structure of the present invention.

As shown in FIG. 8, a wafer 39 which is a workpiece to be exposed is placed on a wafer stage 67, and the wafer is disposed opposed to an X-ray mask structure 38 held by a mask holder (holding means) 66. The X-ray mask structure 38 may be one of those shown in FIGS. 2A, 5, 6 and 7. A supporting film of the mask structure 38, having an X-ray absorptive member, is provided with physical optic elements 40 and 41 to be used for detection of positional deviation of the mask structure 38. Also, the wafer 39 is provided with physical optic elements 42 and 43.

Light of wavelength $\lambda_1$ from a light source 31 such as an LD, is transformed by a collimator lens 32 into parallel light. The parallel light goes through a light projecting lens 33 and a half mirror 34, and it is deflected by a mirror 35. The deflected light passes through a filter (not shown), and then the light impinges on the physical optic elements 40 and 41 disposed on the mask structure 38 and within the exposure region, as well as the physical optic elements 42 and 43 provided on the wafer 39 for detection of lateral deviation. Diffractive light from the physical optic elements 40, 41, 42 and 43 bears information related to lateral deviation between the mask structure 38 and the wafer 39. The diffractive light passes through the aforementioned filter and, then, it is imaged by a light receiving lens 44 upon a light receiving surface of a photodetector 45.

Similarly, light of a wavelength $\lambda_2$ from a light source 46 is transformed by a collimator lens 47 into parallel light which passes through a light projecting lens 48 and is reflected by a half mirror 34. Then, the light is deflected by the mirror 35. The deflected light passes through a filter (not shown) and it impinges on the physical optic elements 40, 41, 42 and 43. Diffractive light from the elements 40–43 bears information related to the spacing between the mask structure 38 and the wafer 39. The diffractive light passes through the filter, and it is imaged by the lens 44 upon the light receiving surface of the photodetector 45.

Figure 9:
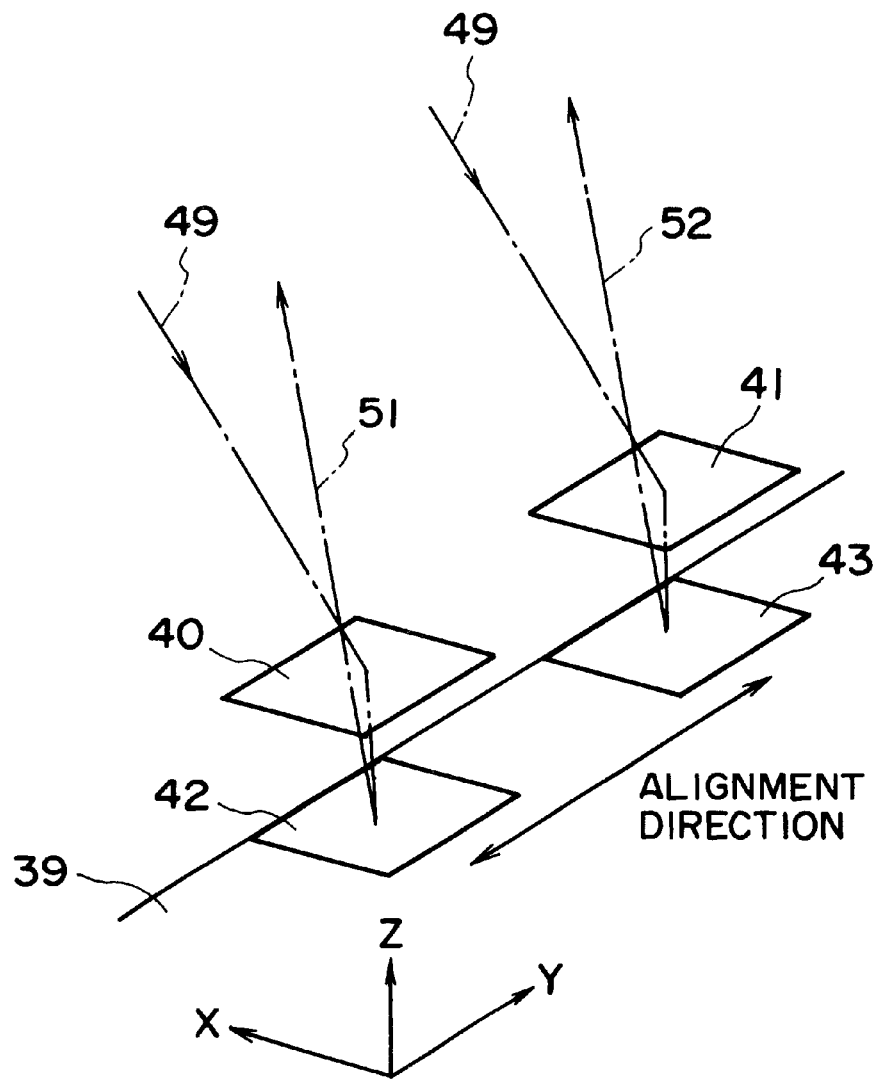
FIG. 9 is a schematic view for explaining physical optic elements provided on an X-ray mask structure and a wafer, in the present invention, and placement and relation of them with projected light.

FIG. 9 is a schematic view for explaining placement of physical optic elements 40–43 of the mask structure 38 and of the wafer 39, as well as the relation with projected light. There are lights 49 projected from the light sources 31 and 46 (FIG. 8) which impinge on the physical optic elements 40, 41, 42 and 43. Diffractive light 51 from the elements 40 and 42 as well as diffractive light 52 from the elements 41 and 43 are directed to the photodetector 45. The elements 40 and 41 are for detection of lateral deviation upon the mask structure 38, while the elements 42 and 43 are for detection of lateral deviation upon the wafer 39. Each of these elements comprises a Fresnel zone plate, but they may be provided by other diffractive gratings, for example.

Figure 10A:
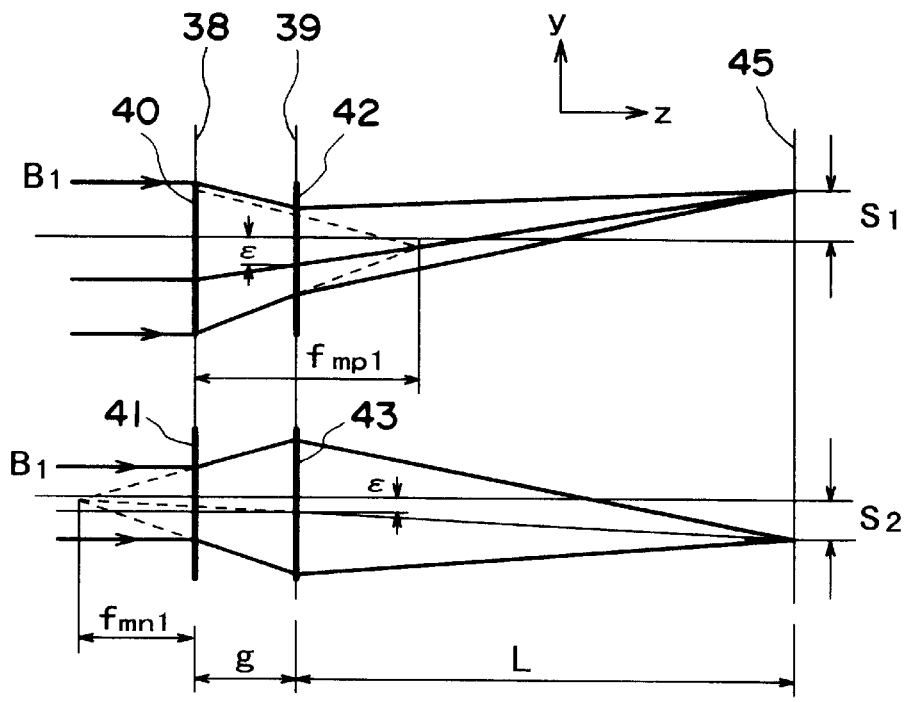
FIGS. 10A and 10B are schematic views, respectively, for explaining the principle of a relative alignment process for an X-ray mask structure and a wafer, with the physical optic elements of FIG. 8 or 9.
Figure 10B:
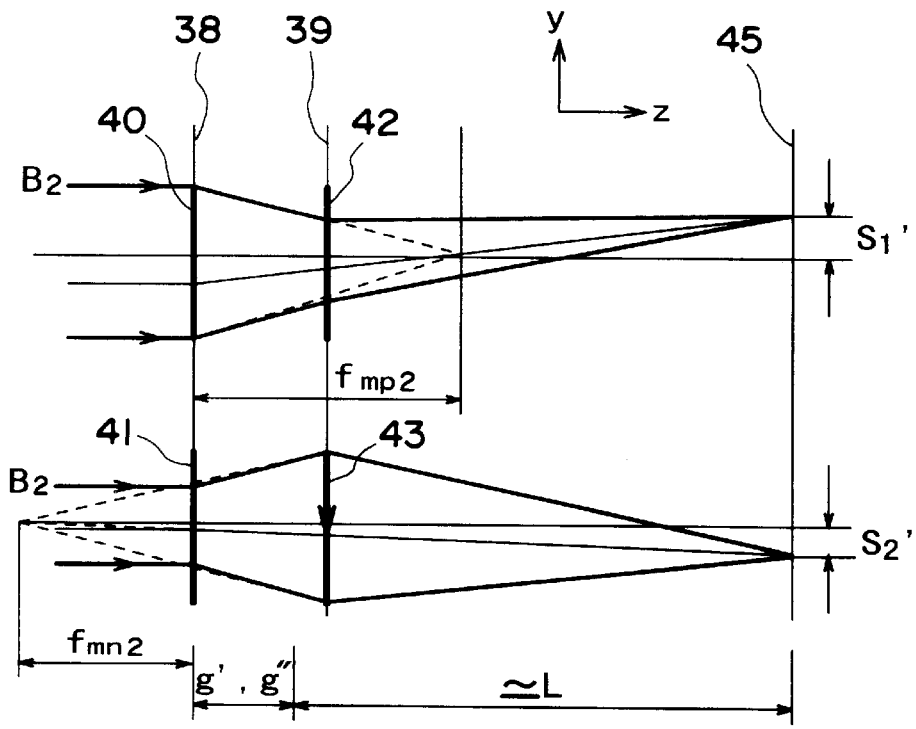

FIGS. 10A and 10B are schematic views for explaining the principle of relative alignment between the X-ray mask structure 38 and the wafer 39, based on the physical optic elements 40–43. In this embodiment, while the projected light is reflected at the wafer and is diffracted thereby, in FIGS. 10A and 10B, the optical components are illustrated as an equivalent transmissive diffractive optical system. FIG. 10A shows that the light of wavelength $\lambda_1$ from the light source 31 (FIG. 8) is projected on the physical optic elements 40–43, and FIG. 10B shows that the light of wavelength $\lambda_2$ from the light source 46 is projected on the elements 40–43.

As shown in FIGS. 10A and 10B, physical optic elements 40 and 41 are disposed on the X-ray mask structure 38, and physical optic elements 42 and 43 are disposed on the wafer 39. Each of these elements comprises a Fresnel zone plate having a lens function, as described above.

Referring to FIG. 10A, a case where light from the light source 31 (FIG. 8) of wavelength $\lambda_1$ is collected on the light receiving surface of the photodetector 45 through the optical elements 40–43, will be described. As shown in FIG. 10A, the mask structure 38 and the wafer 39 are placed so that there is a gap of a distance g between the supporting film of the mask 38 and the wafer 39. The physical optic elements 40, 41, 42 and 43 have focal lengths $f_{mp1}$, $f_{mn1}$, $f_{wn1}$ and $f_{wp1}$, respectively. Light beams $B_1$ of wavelength $\lambda_1$ are projected to the two physical optic elements 40 and 41 on the mask structure 38 as parallel lights. The lights influenced by the lens functions of the physical optic elements 40 and 41, respectively, are collected by the physical optic elements 42 and 43, respectively, disposed opposed to the elements 40 and 41, upon the light receiving surface of the photodetector 45 which is spaced from the wafer 39 by a distance L. Here, if the relative position of the mask 38 and the wafer 39 shifts in the Y direction by $\epsilon$, the positions of the two light spots as collected on the light receiving surface of the photodetector 45 change in accordance with the relative positional deviation of the mask 38 and the wafer 39. Thus, a positional deviation of the two light spots as collected on the light receiving surface of the photodetector 45 corresponds to a change in optical disposition of the physical optic elements 40 and 41 of the mask 38 and the physical optic elements 42 and 43 of the wafer 39. The position of the light spot collected on the photodetector 45 by the elements 40 and 42 displaces by an amount:

$$S_1 = [1 - L/(f_{mp1} - g)] \cdot \epsilon \qquad (6)$$

Also, the position of the light spot collected on the photodetector by the elements 41 and 43 shifts by an amount:

$$S_2 = [1 - L/(f_{mn1} - g)] \cdot \epsilon \qquad (7)$$

Here, if $f_{mp1}$=230 microns, $f_{mn1}$=−230 microns, g= 30 microns, and L=20 mm, it follow that $S_1$=−99.$\epsilon$, and $S_2$=77.9.$\epsilon$. Thus, for a relative positional deviation $\epsilon$ between the mask 38 and the wafer 39, a change in spacing between the two light spots on the photodetector 45 appears while being magnified by 176.9 times. By detecting the change in spacing between the two light spots on the light receiving surface of the photodetector 45, the relative positional deviation $\epsilon$ between the mask and the wafer can be detected precisely. The focal lengths $f_{wn1}$ and $f_{wp1}$ of the physical optic elements 42 and 43 of the wafer 39 for collecting light $B_1$ upon the photodetector 45 can be determined by using imaging formulae, as follows:

$$1/L = 1/(f_{mp1} - g) + 1/f_{wn1} \qquad (8)$$

$$1/L = 1/(f_{mw1} - g) + 1/f_{wp1} \qquad (9)$$

In this embodiment, $f_{mp1}$=230 microns, $f_{mn1}$=−230 microns, g=30 microns, and L=20 mm, as described above, and from this and from equations (8) and (9), it follows that $f_{wn1}$=−202 microns and $f_{wp1}$=256.7 microns.

Referring to FIG. 10B, a case where, with the disposition of optical components shown in FIG. 10A, light of wavelength $\lambda_2$ from the light source 46 (FIG. 8) is collected on the photodetector by the physical optic element 40–43, will be described.

If the focal length of a Fresnel zone plate designed for projection of light of wavelength $\lambda_1$ is $f_1$, a focal length $f_2$ to be provided by that Fresnel zone plate with respect to light of wavelength $\lambda_2$ can be approximated as $f_2 = f_1 \cdot (\lambda_1/\lambda_2)$. Thus, the focal lengths $f_{mp2}$ and $f_{mn2}$ of the physical optic elements 40 and 41 with respect to the wavelength $\lambda_2$ can be expressed as follows:

$$f_{mp2} = f_{mp1} \cdot (\lambda_1/\lambda_2) \qquad (10)$$

$$f_{mn2} = f_{mn1} \cdot (\lambda_1/\lambda_2) \qquad (11)$$

Also, the focal lengths $f_{wn2}$ and $f_{wp2}$ of the physical optic elements 42 and 43 of the wafer 39 with respect to the wavelength $\lambda_2$ can be expressed as follows:

$$f_{wn2} = f_{wp1} \cdot (\lambda_1/\lambda_2) \qquad (12)$$

$$f_{wp2} = f_{wn1} \cdot (\lambda_1/\lambda_2) \qquad (13)$$

The condition that the light of wavelength $\lambda_2$ is imaged on the light receiving surface of the photodetector 45 is determined by equations (14) and (15) below, when g' is the gap between the supporting film of the mask 38 and the wafer 39 as the light of wavelength $\lambda_2$ is imaged on the photodetector 45 through the physical optic elements 40 and 42, while g" is the gap between the supporting film of the mask and the wafer as the light of wavelength $\lambda_2$ is imaged on the photodetector 45 through the physical optic elements 41 and 43.

$$1/L = 1/(f_{mp2} - g') + 1/f_{wn2} \qquad (14)$$

$$1/L = 1/(f_{mn2} - g'') + 1/f_{wp2} \qquad (15)$$

In equations (14) and (15) above, the spacing L between the wafer 39 and the photodetector 45, if the wafer 39 is moved to change the gap between it and the mask 38, changes in a strict sense with a change in gap of the mask and the wafer. Thus, if L' denotes the spacing between the supporting film of the mask structure 38 and the photodetector 45, the spacing L between the wafer 39 and the photodetector 45 becomes L=L'+g' as the light of wavelength $\lambda_2$ is imaged on the photodetector 45 through the physical optic elements 40 and 42. Also, it becomes L=L'+g" as the light of wavelength $\lambda_2$ is imaged on the photodetector 45 through the physical optic elements 41 and 43. However, if the change in gap between the mask and the wafer is small as compared with the spacing L' between the supporting film of the mask structure 38 and the photodetector 45, the aforementioned approximation will be sufficient. From equation (14), it follows that:

$$g' = f_{mp2} - L \cdot f_{wn2}/(f_{wn2} - L) \qquad (16)$$

From equation (15), it follows that:

$$g'' = f_{mn2} - L \cdot f_{wp2}/(f_{wp2} - L) \qquad (17)$$

If $\lambda_1$=0.785 micron and $\lambda_2$=0.635 micron, from equations (16), (10) and (12), the gap g' with which light of wavelength $\lambda_2$ is imaged on the photodetector 45 through the physical optic elements 40 and 42 can be calculated as being g'=37.7 microns. The gap g" with which light of wavelength $\lambda_2$ is imaged on the photodetector 45 through physical optic elements 41 and 43 can be calculated in accordance with equations (17), (11) and (13) as being g"=38.1 microns.

In this embodiment, an average of gaps g' and g" is taken, and, when the wavelength $\lambda_2$ is used, the gap between the mask structure 38 and the wafer 39 is set to 37.9 microns, and then the positional deviation between the mask and the wafer is detected. Here, in accordance with the positional deviation between the mask structure 38 and the wafer 39, magnification of positional deviations $S_1'$ and $S_2'$ of two light spots on the light receiving surface of the photodetector 45 changes from the aforementioned positional deviations $S_1$ and $S_2$. If in equation (6) $f_{mp1}$ is replaced by $f_{mp2}$ and calculation is made with g=38.1 microns, then $S_1'=-80.2 \cdot \epsilon$ is obtained. If in equation (7) $f_{mn1}$ is replaced by $f_{mn2}$ and calculation is made with g=38.1 microns, then $S_2'=63.1 \cdot \epsilon$ is obtained.

Figure 11:
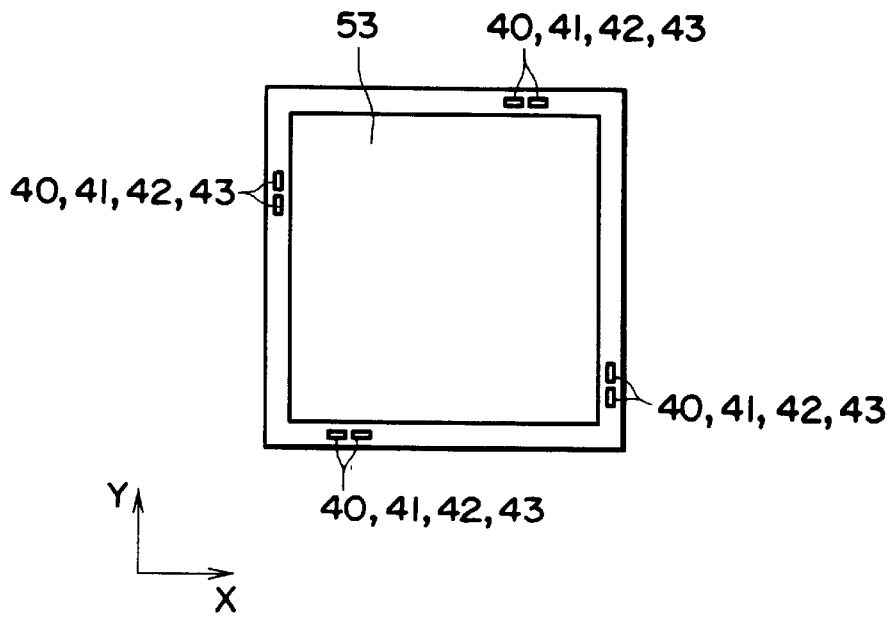
FIG. 11 is a schematic view for explaining placement of the physical optic elements of FIG. 8 or 9.

Thus, when alignment light of wavelength $\lambda_2=0.635$ micron is used, for a positional deviation of the mask and the wafer, the spacing between the spots shifts while being magnified by 143.3 times. This means that, if the alignment process is made by use of light of different wavelengths, for every wavelength there should be a parameter (magnification and offset) for calculation of positional deviation between the mask and the wafer. Further, if light of another wavelength is to be used as alignment light, similarly, an appropriate gap may be calculated by using equations (11)–(17) and, after adjusting spacing between the mask and the wafer to that gap, positional deviation of the mask and the wafer may be detected. This enables high precision detection of positional deviation of the mask and the wafer with use of light imaged on the photodetector 45, independently of the wavelength of alignment light. While FIG. 8 shows a system with physical optic elements (alignment marks) 40–43 and photodetector (optical pickup) 45 for detection of positional deviation with respect to one axial direction, the X-ray exposure apparatus of this embodiment uses alignment marks and optical pickups disposed equiangularly as shown in FIG. 11, so that they are juxtaposed to four sides of an IC region 53 of a square shape, corresponding to the exposure view angle. On the basis of four positional deviation detection signals obtainable from these alignment marks, shift components in X and Y directions as well as a chip rotation component are calculated by using a calculator 65 (FIG. 8). In accordance with the relative positional deviation, the movement amount of the mask holder (holding means) 66 or of the wafer stage 67 is determined, and corresponding drive signals are applied to actuators 68 and 69.

One of the X-ray mask structures shown in FIGS. 2A, 5, 6 and 7 is loaded into the X-ray exposure apparatus of this embodiment, and an alignment process for the mask structure with a wafer is performed. Since reflection of alignment light at the thin film (dust protection film) of the X-ray mask structure is prevented, there occurs no interference between alignment light having information of positional deviation of the mask and alignment light reflected by the thin film of the mask structure. Therefore, the positional deviation between the mask and the wafer can be detected precisely. This accomplishes high precision alignment, without being influenced by reflection light at the thin film (dust protection film). After completion of high precision alignment of the mask and the wafer, the pattern of the mask structure is transferred to the wafer by exposure. Thus, production of microdevices such as semiconductor devices with a good yield, is enabled.

The alignment method is not limited to the one used in this embodiment. Any other alignment method may be used with the present invention.

Figure 12A:
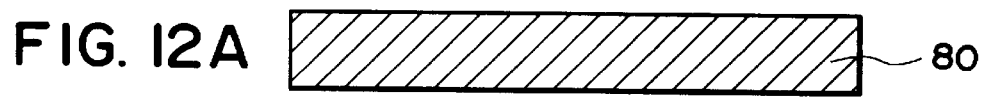
FIGS. 12A–12C are schematic views, respectively, for explaining a process for producing a thin film of an X-ray mask structure of FIG. 2A.
Figure 12B:
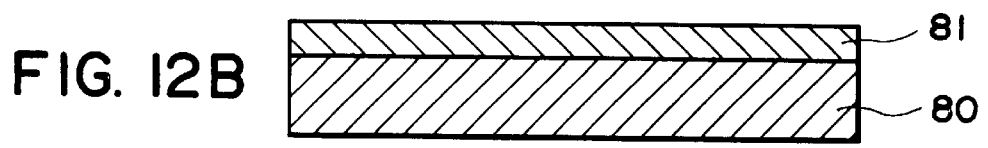
Figure 12C:
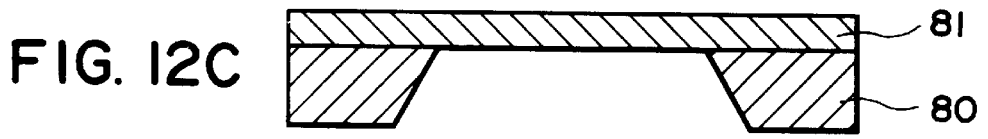

Referring to FIGS. 12A–12C, the method of forming a thin film 6 as a dust protection film will be described.

In FIG. 12A, a substrate 80 is prepared first. Then, in FIG. 12B, a thin film 81 is formed on the surface of the substrate 80 by using a film forming apparatus such as a CVD apparatus, for example. After this, in FIG. 12C, the bottom face of the substrate 80 is back-etched to remove predetermined portions of the substrate 80, whereby the thin film 81 is produced. This thin film 81 can be used as the thin film 6 of FIGS. 2A, 5 and 6 or thin film 6a or 6b FIG. 7. The portion of the substrate 80 which remains without being back-etched, can be used as the holding frame 10 of FIGS. 5 and 6 or the holding frame 10a or 10b of FIG. 7.

The film forming apparatus to be used in production of thin film 6 (dust protection film) with an anti-reflection function to alignment light, is not limited to a CVD apparatus. Any system which enables high precision control of film thickness, may be used. In order to accomplish the film thickness just as designed, without film formation, any excessive film thickness may be removed by etching. On that occasion, a thin film may be first formed by using a film forming apparatus to a thickness larger than a design value, and, after measuring the thickness of the film by using a thickness measuring device, any excessive thickness may be removed by etching.

Specific examples of components of an X-ray mask structure according to this embodiment will be described.

The supporting film 2 should transmit X-rays sufficiently, and also it should be self-standing. Preferably, therefore, the film 2 may have a thickness in a range of 1–10 microns. The supporting film may be made of a known material, such as an inorganic film of Si, $SiO_2$, SiN, SiC, SiCN, BN, Al or C, for example, in the form of a single or composite film.

The X-ray absorptive member 3 should have good X-ray absorptiveness, and it should be easy to be machined. Preferably, it may have a thickness in the range of 0.2–1.0 micron, and it may be made of a heavy metal such as Au, W, Ta or Pt, for example, or of a composite of them. The holding frames 1, 10, 10a and 10b for holding the supporting film 2 may be made of a silicon wafer, for example.

The reinforcing member 4 for reinforcing the holding frame 1, 10, 10a or 10b may be made of a glass material such as Pyrex glass or quartz glass, for example, or of Si or ceramics. Preferably, one having a Young's module not lower than 50 GPa and a linear expansion coefficient not greater than $1 \times 10^{-5} K^{-1}$, may be used.

The thin film to be provided on one side or both sides of the supporting film 2 may preferably have a thickness in a range of 0.1–5 microns, to avoid reduction in intensity of X-rays. A thickness of 0.1–1.5 microns is particularly preferable. As regards the material of this thin film, an inorganic film such as Si, $SiO_2$, SiN, SiC, SiCN, BN, AlN or C, for example, or a radiation resistive organic film such as polyimide, polyester, polyphenylene sulfite, polypropylene, cellulose (nitrocellulose, cellulose acetate), polyvinylbutyl, polymethylmethacrylate, polyvinyl chloride, or polyvinyl acetate, for example, or a copolymer of them may be used. The thin film may be made of a single material of them, or it may be a composite film using plural materials. In order to provide an electrification preventing function, an electrically conductive polymer such as polyathene, polyphenylene vinylene, poly-(p-phenylene). $TiO_2$ polydiacetylene, ITO or C may be provided on the thin film. Alternatively, the thin film itself may be made of these materials. Polyphenylene sulfite is effective because it has good conductivity and good radiation resistance. The thin film provided by a single material film or a composite film of these materials is constituted by a material and a thickness as having an anti-reflection function with respect to alignment light (wavelength $\lambda$) of an X-ray exposure apparatus. This anti-reflection function is not limited to a case where reflection of alignment light at the thin film (pellicle) as a dust protection film is completely avoided, but it includes a function for reducing the reflection of alignment light to a level that does not degrade the alignment precision. Preferably, the pellicle may be provided with an anti-reflection function with which the reflection factor of the pellicle to the alignment light is 1% or less.

As regards the adhesive agent 7, a material of acrylic series, silicon series, rubber series, and epoxy series may be used. The spacing between the thin film at the workpiece side and the supporting film 2 depends on the exposure gap between the X-ray mask and the workpiece. Preferably, it may be controlled to 10 microns or less. The flatness of the thin film may preferably be controlled to 3 microns or less. The control may be based on a warp of the holding frame 1 due to stress of the supporting film 2 in a case where the thin film is directly adhered to the holding frame, and the supporting film 2 may be supported at the topmost of the holding frame 1 while the film 2 may be mounted on the side of the holding frame 1. In this case, while the flatness of the thin film and the spacing between the thin film and the supporting film 2 depend on the warp of the holding frame 1, it depends on the stress of the supporting film 2 and the thickness or rigidity of the holding frame 1. If an appropriate warp of about a few microns is not obtainable, the holding frame 1 may be machined. When the thin film 6 is mounted on the reinforcing member 4, the thin film may be supported at the topmost of the holding frame similarly as above, and the holding frame 1 may be mounted on the reinforcing member 4. The thin film may alternatively be supported by the reinforcing member 4. In the latter case, machining precision of reinforcing member 4 as well as precision of the mount of the supporting film 2 to the reinforcing member 4 should be controlled exactly. As regards precise adhesion of the holding frame 1 and the reinforcing member 4, a method disclosed in Japanese Laid-Open Patent Application, Laid-Open No. 293716/1991 may be used, for connecting the holding frame 1 and the reinforcing member 4 with the use or without the use of an adhesive agent.

When the reinforcing member 4 is machined, in FIGS. 5 and 6, by precisely adjusting the flatness of the portion of the reinforcing member 4 to which the holding frame 10 is to be adhered, the flatness of the thin film 6 can be controlled very precisely. Similarly, in the X-ray mask structure of FIG. 7, by precisely controlling the flatness of the portion of the reinforcing member to which the holding frame 10a or 10b is to be adhered, the flatness of the thin film 6a or 6b can be controlled precisely.

Second Embodiment

Figure 13:
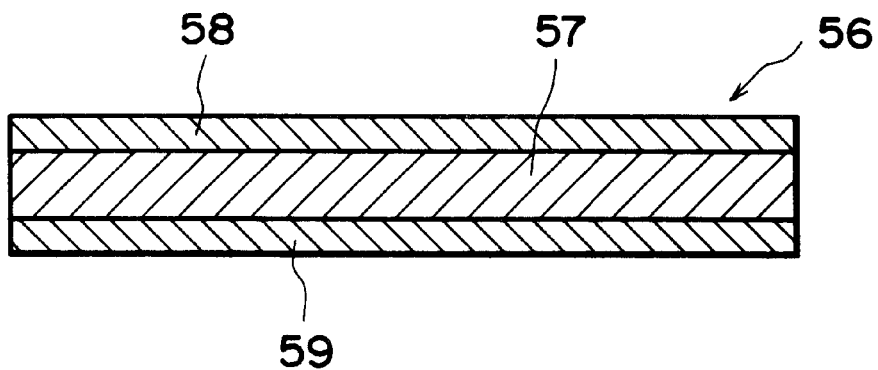
FIG. 13 is a schematic view for explaining an X-ray mask structure according to a second embodiment of the present invention.

FIG. 13 is a schematic view for explaining an X-ray mask structure according to a second embodiment of the present inventions. In the first embodiment, the thin film (dust protection film) having an anti-reflection function to alignment light is made of a single material. In the second embodiment, on the other hand, the thin film (dust protection film) is made of plural materials in layers. FIG. 13 shows the sectional structure of a thin film (dust protection film) which is one of the components of an X-ray mask structure according to this embodiment. Disposition of the dust protection film in the X-ray mask structure of this embodiment, as well as the other components are similar to those shown in FIGS. 2A, 5, 6 or 7 of the first embodiment.

As shown in FIG. 13, a thin film 56 having an anti-reflection function to alignment light has a structure that, on the surface of a first material film 57, a second material film 58 is formed, and that, at the bottom face of the first material film 57, a second material film 59 is formed. The second material film 58 and the second material film 59 have the same thickness.

Figure 14:
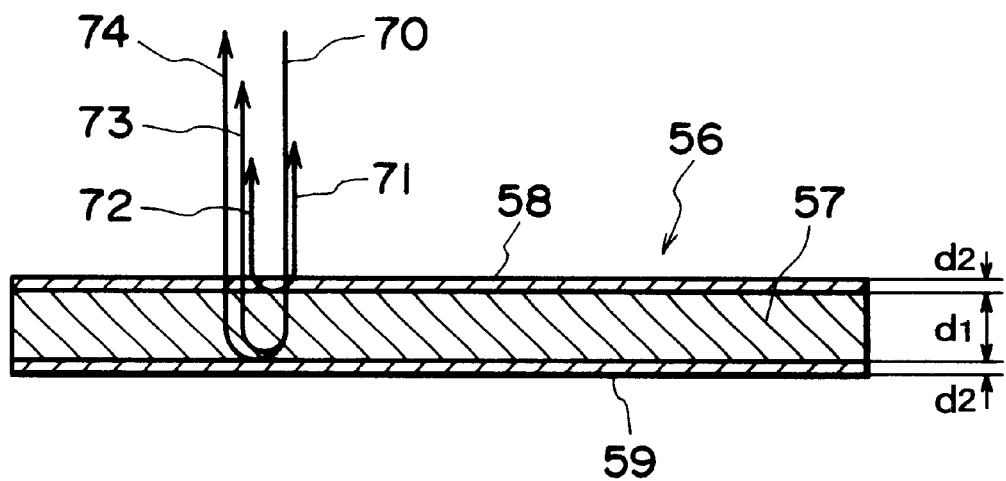
FIG. 14 is a sectional view for explaining the principle of an anti-reflection function of the thin film of FIG. 13, with respect to alignment light.

Referring to FIG. 14, the principle of an anti-reflection function of the thin film 56 to alignment light will be described. In FIG. 14, $d_1$ is the thickness of the first material film 57, and $d_2$ is the thickness of the second material films 58 and 59. The first material film 57 has a refractive index $n_1$. The second material films 58 and 59 are made of the same material, and they have a refractive index $n_2$. The ambience surrounding the thin film 56 has a refractive index $n_0$.

As shown in FIG. 14, when alignment light 70 is projected on the thin film 56 of a multilayered structure from the second material film 58 side, a portion of the alignment light 70 is reflected at the interface between the second material film 58 and the ambience, whereby reflection light 71 is produced. Another portion of the alignment light 70 passing the interface between the second material film 58 and the ambience is reflected at the interface between the second material film 58 and the first material film 57, whereby reflection light 72 is produced. Another portion of the alignment light 70 passing through the second material film 58 is reflected at the interface between the first material film 57 and the second material film 59, whereby reflection light 73 is produced. Further, a portion of the alignment light passing the second material film 58 and the first material film 57 is reflected at the interface between the second material film 59 and the ambience, whereby reflection light 74 is produced.

As the condition for attaining an anti-reflection function of the thin film 56 with respect to alignment light 70, in order to reduce the reflection factor at one side, the phase difference between the reflection light 71 and the reflection light 72 is made equal to $\pi$ radian, while the intensities of the reflection lights 71 and 72 are made even. Similarly, as regards reflection lights 73 and 74, the phase difference of them is made equal to $\pi$ radian, while the intensities of them are made even. Further, the phase difference between one of the reflection lights 71 or 72 reflected at the top face side of the thin film 56 and one of the reflection lights 73 and 74 reflected at the bottom face side of the thin film 56 is made equal to $\pi$ radian, while the intensities of these two lights having their phase difference adjusted to $\pi$ radian are made even. In this embodiment, the phase difference between the reflection lights 71 and 73 is made equal to $\pi$ radian and the intensities of them are made even, while the phase difference between the reflection lights 72 and 74 is made equal to $\pi$ radian and the intensities of them are made even. When these conditions are expressed in equations, where $\lambda$ is the wavelength of alignment light and $m_1$ and $m_2$ are natural numbers, it follows that:

$$n_2 = \sqrt{n_1} \tag{18}$$

$$2n_2 d_2 = (2m_1 - 1) \cdot \lambda/2 \tag{19}$$

$$n_1 d_1 + n_2 d_2 = m_2 \lambda/2 \tag{20}$$

When equations (18), (19) and (20) are satisfied, in principle, reflection of alignment light 70 at the thin film 56 becomes zero. Even if there is no combination of materials that completely satisfies the condition, particularly in equation (18), by using a combination of materials satisfying a relation $n_1 < n_2$ and close to that defined by equation (18), a thin film 56 having a sufficient anti-reflection function to alignment light can be accomplished.

In this embodiment, the first material film 57 is made of SiN having a refractive index $n_1 = 2.1$, and the second material films 58 and 59 are made of $SiO_2$ with a refractive index $n_2 = 1.46$.

Figure 15:
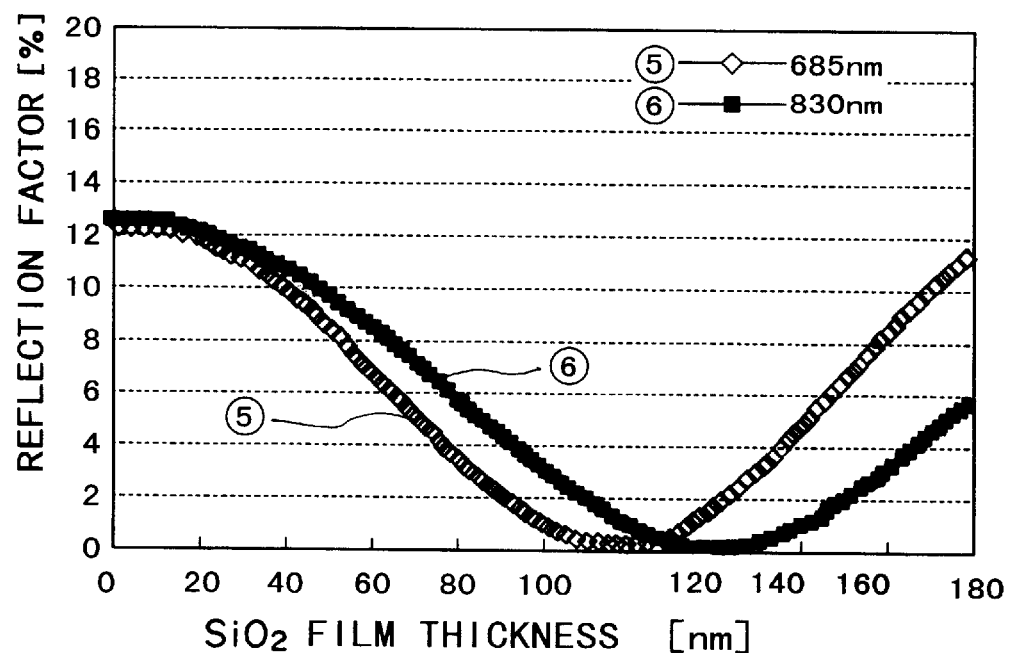
FIGS. 15 and 16 are graphs, respectively, for explaining an anti-reflection function of the thin film of FIG. 13, with respect to alignment light.

FIG. 15 is a graph for explaining an anti-reflection function of the thin film 56 to alignment light. FIG. 15 shows the results of calculation of a reflection factor at one side of the thin film 56, as it is made of a combination of SiN and $SiO_2$. The axis of abscissa in FIG. 15 denotes the thickness (nm) of $SiO_2$ film as the second material films 58 and 59, and the axis of ordinate denotes the reflection factor (%). The alignment light uses light of a wavelength $\lambda_1$=685 nm and light of a wavelength $\lambda_2$=830 nm. Illustrated in the drawing are changes in reflection factor with respect to the thickness range in which the thickness of the second material films 58 and 59 providing a lowest reflection factor to wavelength $\lambda_1$ and the thickness of the films 58 and 59 providing a lowest reflection factor to wavelength $\lambda_2$ become approximately equal to each other. A curve #5 represents the reflection factor at one side of film 56 with respect to wavelength $\lambda_1$=685 nm, and a curve #6 represents the reflection factor at one side of film 56 with respect to wavelength $\lambda_2$=830 nm.

It is seen from FIG. 15 that, when the $SiO_2$ film (second material film) is formed with a thickness 130 ±10 nm, the reflection factor at one side of film 56 to alignment light of wavelengths $\lambda_1$ and $\lambda_2$ can be held at 1.3% or less.

Figure 16:
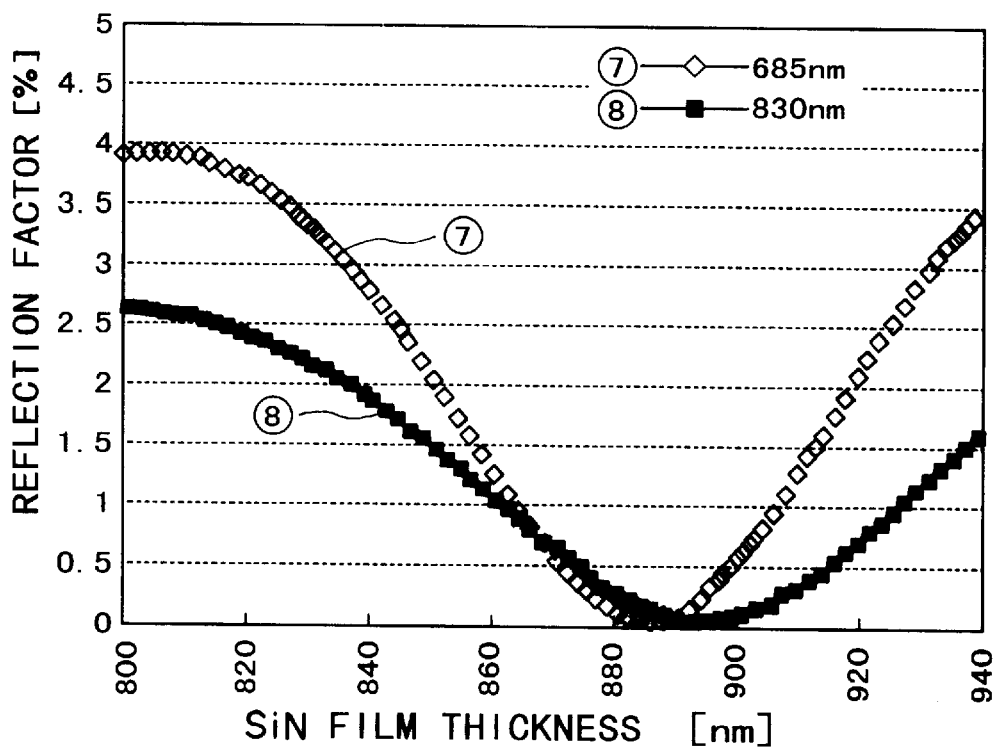

FIG. 16 is a graph for explaining an anti-reflection function of the film 56 to alignment light, and it shows the results of calculation of the reflection factor, having considered the reflection lights on both sides of the film 56, that is, all reflection lights 71–74 of FIG. 14. The axis of abscissa in FIG. 16 denotes the thickness (nm) of SiN film as the first material film 57, and the axis of ordinate denotes the reflection factor (%). A curve #7 represents the reflection factor of the film 56 as a whole with respect to wavelength $\lambda_1$=685 nm, and a curve #8 represents the reflection factor of the film 56 as a whole with respect to wavelength $\lambda_2$=830 nm.

It is seen from FIG. 16 that, when the SiN film has a thickness 880±20 nm, the reflection factor with respect to both the wavelengths $\lambda_1$ and $\lambda_2$ can be held at 1% or less. Thus, if the SiN film is made with a thickness precision of 880±10 nm, the reflection factor can be held at 0.4% or less.

When a dust protection film with an anti-reflection function is formed by using a multilayered film, as compared with one made of a single material, the film thickness precision in film thickness control for film formation may advantageously be loosened.

In this embodiment, on the opposite sides of the first material film 57, second material films having a smaller refractive index than the first material film are provided. However, the second material film 58 or 59 may be provided only on one side of the first material film 57. On that occasion, however, the effect of an anti-reflection function to alignment light may be reduced slightly. The second material film 58 or 59 which functions as a coating to the first material layer 57, is not limited to a single layer. Plural layers made of plural materials may be provided on the first material film 57 as a coating film, such that the second material film may have a multilayered structure.

As regards materials for the second material film 58 or 59, one effective to apply an electrification prevention effect to thin film 56, an electrically conductive polymer such as polyathene, polyphenylane vinylene, poly-(p-phenylene), $TiO_2$ polydiacetylene, ITO or C may be effectively used.

Referring to FIGS. 17A–17E, a method of forming the thin film 57 will be described.

Figure 17A:
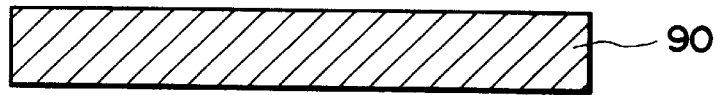
FIGS. 17A–17E are schematic views, respectively, for explaining a process for forming the thin film of FIG. 13.
Figure 17B:
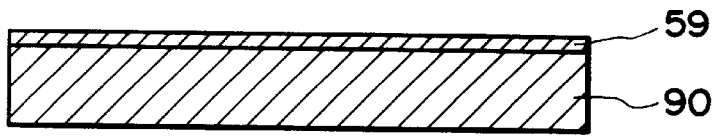
Figure 17C:
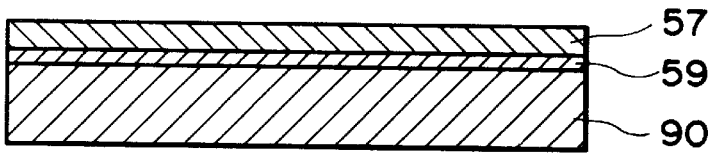
Figure 17D:
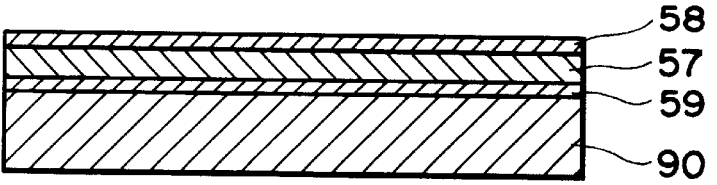
Figure 17E:
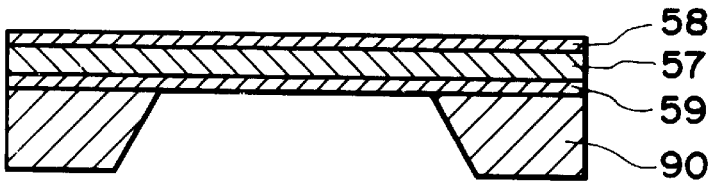

In FIG. 17A, a substrate 90 is prepared first. Then, in FIG. 17B, a second material film 59 is formed on the surface of the substrate 90 by using a film forming apparatus such as a CVD apparatus, for example. After this, in FIG. 17C, a first material film 57 is formed on the surface of the second material film 59, by using a film forming apparatus such as a CVD apparatus, for example. Subsequently, in FIG. 17D, a second material film 58 is formed on the surface of the first material film 57, by using a film forming apparatus such as a CVD apparatus, for example. Thereafter, in FIG. 17E, the bottom face of the substrate 90 is back-etched to remove predetermined portions of the substrate 90, whereby the thin film 56 is produced.

The film forming apparatus to be used in production of thin film 56 (dust protection film) with an anti-reflection function to alignment light, is not limited to a CVD apparatus. Any system which enables high precision control of film thickness, may be used. In order to accomplish the film thickness just as designed, without film formation, any excessive film thickness may be removed by etching. On that occasion, a thin film may be first formed by using a film forming apparatus to a thickness larger than a design value, and, after measuring the thickness of the film by using a thickness measuring device, any excessive thickness may be removed by etching. For production of multilayered thin film 56, a thin film of a single material may be formed in accordance with the method having been described with reference to the first embodiment and to FIG. 12 and, after that, a film of another material may be formed on one side or both sides of the thin film, to provide a multilayered thin film structure.

Third Embodiment

Referring to FIG. 8, a third embodiment of the present invention will be described in relation to an X-ray exposure method which uses an X-ray mask structure of the first or second embodiment. In the X-ray exposure method of this embodiment, an X-ray exposure apparatus such as described with reference to FIG. 8 may be used for production of microdevices such as a semiconductor device, thin film magnetic head, or micro-machine, for example.

Except for the use of an X-ray mask structure according to the first or second embodiment, the X-ray exposure method or exposure apparatus of this embodiment is based on any known method and apparatus.

The X-ray exposure apparatus of FIG. 8 is used with an SOR ring (not shown) which is a synchrotron orbit radiation source. Synchrotron radiation light of a sheet-beam shape emitted from the SOR ring has a sheet-like beam shape being expanded in a lateral direction with a uniform light intensity but having substantially no expansion in the vertical direction. This synchrotron radiation light is reflected by a cylindrical mirror (not shown) by which it is expanded in the vertical direction. By this, a beam having an approximately rectangular sectional shape is produced, and thus, an exposure region of a rectangular shape is provided. The expanded synchrotron radiation light is directed to the X-ray mask structure 38 (FIG. 8). The mask structure may comprise one of those shown in FIGS. 2A, 5, 6 and 7. The mask structure is attracted to a mask stage, by a mask holder 66, so that it is held at a position opposed to a wafer 39 which is a workpiece to be exposed. The wafer 39 is held by a wafer chuck which is mounted on a wafer stage 67. The wafer stage 67 can be moved for positioning of the wafer 39.

An alignment unit for aligning the mask and the wafer as described with reference to the first and second embodiments, comprises an optical system for detecting alignment marks provided on the mask and the wafer for positioning of them, and calculating means for calculating a deviation between the mask and the wafer. With the use of the X-ray mask structure 38 of the present invention, the thin film (dust protection film) of the mask structure accomplishes a transmission factor of 80% or more and a reflection factor of 1% or less with respect to different wavelengths used in the alignment process. Thus, the signal to noise ratio for alignment light can be improved, and high precision alignment of the mask and the wafer is assured.

After alignment of the mask 38 and the wafer 39 is completed, the pattern formed on the mask is transferred to the wafer 39 in accordance with a step-and-repeat method or scan method. This meets mass production of microdevices based on high precision X-ray lithography.

Fourth Embodiment

Referring to FIG. 18, a semiconductor device manufacturing method according to a fourth embodiment of the present invention will be described. This embodiment uses an X-ray exposure apparatus as having been described with reference to the first or third embodiment.

FIG. 18 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 19:
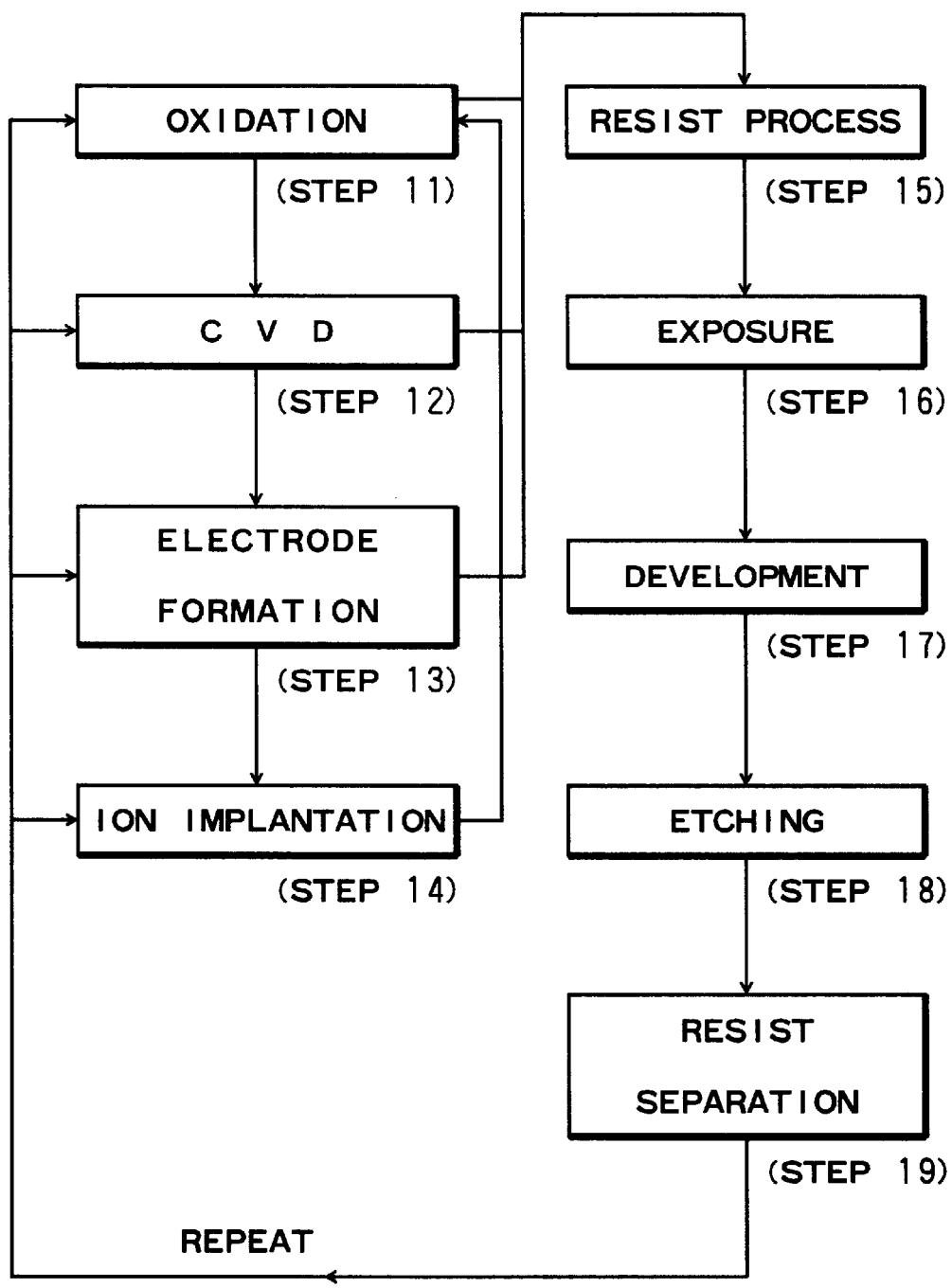
FIG. 19 is a flow chart for explaining details of the wafer process in FIG. 18.

FIG. 19 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A mask structure for X-ray lithography, comprising:
an X-ray transmission film to be disposed opposed to a workpiece in X-ray exposure, the X-ray transmission film having an X-ray absorptive material corresponding to a pattern to be printed on the workpiece; and
a thin film covering at least a portion of the X-ray transmission film, at a position spaced apart from the X-ray transmission film to define a space between the X-ray transmission film and the thin film, the thin film having (i) a first anti-reflection property with respect to first alignment light of a first wavelength different from that of X-rays used for the X-ray exposure, and (ii) a second anti-reflection property with respect to second alignment light of a second wavelength different from the first wavelength and from that of the X-rays used for the X-ray exposure.

2. A mask structure according to claim 1, wherein the thin film is provided at the workpiece side of the X-ray transmission film so the space is formed at the workpiece side of the X-ray transmission film.

3. A mask structure according to claim 2, wherein the thin film and the X-ray transmission film are disposed with a spacing not greater than 10 microns.

4. A mask structure according to claim 1, wherein the thin film is provided at a side of the X-ray transmission film remote from the workpiece, so the space is formed at that side of the X-ray transmission film.

5. A mask structure according to claim 1, further comprising another thin film provided at a side of the X-ray transmission film remote from said thin film.

6. A mask structure according to claim 1, wherein at least a portion of the thin film has the anti-reflection property to alignment light, to which portion the alignment light is projected.

7. A mask structure according to claim 1, wherein the thin film is made of a single material and satisfies a relation $d = m\lambda/2n$, where d is the thickness of the thin film, n is a refractive index of the thin film material, $\lambda$ is the wavelength of the alignment light, and m is a natural number.

8. A mask structure according to claim 7, wherein the material is one of SiC and SiN.

9. A mask structure according to claim 1, wherein the thin film comprises a laminated structure or plural layers, and wherein adjacent layers are made of different materials.

10. A mask structure according to claim 9, wherein the thin film includes a first material film and a second material film provided on the first material film.

11. A mask structure according to claim 10, wherein a relation $n_2 = \sqrt{n_1}$ is satisfied, where $n_1$ and $n_2$ are refractive indices of the first and second materials with respect to the alignment light, respectively.

12. A mask structure according to claim 10, wherein a relation $d_2 = (2m_1-1)\cdot\lambda/4n_2$ is satisfied, where $d_2$ is the thickness of the second material film, $\lambda$ is the wavelength of alignment light, $n_2$ is the refractive index of the second material with respect to the alignment light, and $m_1$ is a natural number.

13. A mask structure according to claim 9, wherein the thin film includes a first material film, and second material films provided on opposite surfaces of the first material film.

14. A mask structure according to claim 13, wherein a relation $n_2 = \sqrt{n_1}$ is satisfied, where $n_1$ and $n_2$ are refractive indices of the first and second materials with respect to the alignment light, respectively.

15. A mask structure according to claim 13, wherein a relation $d_2 = (2m_1-1)\cdot\lambda/4n_2$ is satisfied, where $d_2$ is the thickness of the second material film, $\lambda$ is the wavelength of alignment light, $n_2$ is the refractive index of the second material with respect to the alignment light, and $m_1$ is a natural number.

16. A mask structure according to claim 13, wherein a relation $n_1 d_1 + n_2 d_2 = m_2 \lambda/2$ is satisfied, where $n_1$ and $n_2$ are refractive indices of the first and second materials with respect to the alignment light, $d_1$ and $d_2$ are thicknesses of the first and second material films, respectively, $\lambda$ is the wavelength of the alignment light, and $m_2$ is a natural number.

17. A mask structure according to claim 1, wherein the thin film has a reflection factor adjusted to be 1% or less with respect to the alignment light.

18. A mask structure according to claim 9, wherein the plural layers include a film of SiN and a film of $SiO_2$.

19. A mask structure according to claim 1, wherein the thin film serves as a dust protection film for the X-ray transmission film.

20. A mask structure according to claim 1, wherein the thin film is detachably mounted with respect to the X-ray transmission film.

* * * * *